(12) United States Patent
Todorokihara

(10) Patent No.: US 11,095,302 B2
(45) Date of Patent: Aug. 17, 2021

(54) FREQUENCY DELTA SIGMA MODULATION SIGNAL OUTPUT CIRCUIT, PHYSICAL QUANTITY SENSOR MODULE, AND STRUCTURE MONITORING DEVICE

(71) Applicant: Seiko Epson Corporation, Tokyo (JP)

(72) Inventor: Masayoshi Todorokihara, Suwa (JP)

(73) Assignee: Seiko Epson Corporation

( * ) Notice: Subject to any disclaimer, the term of this patent is extended or adjusted under 35 U.S.C. 154(b) by 123 days.

(21) Appl. No.: 16/395,465

(22) Filed: Apr. 26, 2019

(65) Prior Publication Data

US 2019/0334544 A1  Oct. 31, 2019

(30) Foreign Application Priority Data

Apr. 27, 2018  (JP) .............................. JP2018-086185

(51) Int. Cl.
*H03M 3/00* (2006.01)
*G01C 9/06* (2006.01)
*H03L 7/085* (2006.01)

(52) U.S. Cl.
CPC ................ *H03M 3/30* (2013.01); *G01C 9/06* (2013.01); *H03L 7/085* (2013.01)

(58) Field of Classification Search
CPC ....... H03M 3/30; G01C 9/06; G01C 19/5776; H03L 7/085; G01P 15/097; G01D 3/036
See application file for complete search history.

(56) References Cited

U.S. PATENT DOCUMENTS

| | | | | |
|---|---|---|---|---|
| 5,561,660 A | * | 10/1996 | Kotowski | ............... H03F 1/303 370/215 |
| 7,193,546 B1 | * | 3/2007 | Melanson | ............... H03M 3/38 341/118 |
| 7,276,985 B2 | * | 10/2007 | Hirano | ................. H03C 3/0925 332/128 |
| 9,479,185 B2 | * | 10/2016 | Cali | ....................... H03L 7/1806 |

FOREIGN PATENT DOCUMENTS

| | | |
|---|---|---|
| JP | 2016-156666 A | 9/2016 |
| JP | 2017-167041 A | 9/2017 |

* cited by examiner

*Primary Examiner* — Brian K Young
(74) *Attorney, Agent, or Firm* — Harness, Dickey & Pierce, P.L.C.

(57) ABSTRACT

A frequency delta sigma modulation signal output circuit includes a phase modulation circuit that outputs a phase modulation signal based on a delay signal obtained by delaying a signal to be measured, in synchronization with the signal to be measured, and a frequency ratio digital conversion circuit that generates a frequency delta sigma modulation signal using a reference signal and the phase modulation signal.

12 Claims, 11 Drawing Sheets

FREQUENCY DELTA SIGMA MODULATION SIGNAL OUTPUT CIRCUIT, PHYSICAL QUANTITY SENSOR MODULE, AND STRUCTURE MONITORING DEVICE

The present application is based on and claims priority from JP Application Serial Number 2018-086185, filed Apr. 27, 2018, the disclosure of which is hereby incorporated by reference herein in its entirety.

BACKGROUND

1. Technical Field

The present disclosure relates to a frequency delta sigma modulation signal output circuit, a physical quantity sensor module, and a structure monitoring device.

2. Related Art

A frequency delta sigma modulation signal output device that generates a frequency delta sigma modulation signal indicating a ratio between a frequency of a reference signal and a frequency of a signal to be measured. The frequency delta sigma modulation signal output device includes a frequency delta sigma modulator, and performs frequency delta sigma modulation on a signal to be measured using the reference signal by the frequency delta sigma modulator, generates the frequency delta sigma modulation signal, and outputs the frequency delta sigma modulation signal.

In general, matters that periodic quantization noise called an idle tone is generated at an output of the delta sigma modulator are known. Even in the frequency delta sigma modulation signal output device, the idle tone is noise directly related to deterioration of measurement accuracy thereof.

In JP-A-2017-167041, a frequency delta sigma modulation device which includes a reference signal generator that generates a reference signal whose frequency is modulated and the frequency modulator that performs frequency delta sigma modulation on the signal to be measured based on the reference signal and generates the frequency delta sigma modulation signal is described. According to the frequency delta sigma modulation device described in JP-A-2017-167041, by using the frequency modulation signal as the reference signal, the time to remain at an operation point decreases even at the operation point at which the idle tone becomes large, thereby capable of reducing the influence of the idle tone.

However, while it is possible to reduce the idle tone, noise and floor noise which are factors of a signal-to-noise ratio (SNR) are not sufficiently reduced, so that there is a problem that it is required to further reduce the noise and the floor noise contained in the signal while reducing the idle tone.

SUMMARY

A frequency delta sigma modulation signal output circuit according to an aspect of the present disclosure includes a phase modulation circuit that outputs a phase modulation signal based on a delay signal obtained by delaying a signal to be measured, in synchronization with the signal to be measured, and a frequency ratio digital conversion circuit that generates a frequency delta sigma modulation signal using a reference signal and the phase modulation signal.

In the frequency delta sigma modulation signal output circuit according to the aspect of the present disclosure, the phase modulation circuit may generate the phase modulation signal by selecting and using one of a plurality of the delay signals.

In the frequency delta sigma modulation signal output circuit according to the aspect of the present disclosure, the phase modulation circuit may generate the phase modulation signal by periodically selecting and using one of the plurality of delay signals.

In the frequency delta sigma modulation signal output circuit according to the aspect of the present disclosure, the phase modulation circuit may generate the phase modulation signal by selecting and using any one of the signal to be measured and the delay signal.

In the frequency delta sigma modulation signal output circuit according to the aspect of the present disclosure, the phase modulation circuit may generate the phase modulation signal by periodically selecting and using any one of the signal to be measured and the delay signal.

In the frequency delta sigma modulation signal output circuit according to the aspect of the present disclosure, the frequency ratio digital conversion circuit may include a plurality of frequency delta sigma modulation circuits coupled in parallel.

In the frequency delta sigma modulation signal output circuit according to the aspect of the present disclosure, a filter circuit may be provided behind the frequency ratio digital conversion circuit.

In the frequency delta sigma modulation signal output circuit according to the aspect of the present disclosure, the filter circuit is a low pass filter circuit, modulation of the phase modulation signal includes a predetermined cycle, and a frequency which is a reciprocal of the predetermined cycle may be higher than a cutoff frequency of the low pass filter circuit.

A physical quantity sensor module according to another aspect of the present disclosure includes the frequency delta sigma modulation signal output circuit according to the aspect of the present disclosure, and a physical quantity sensor that outputs the signal to be measured.

In the physical quantity sensor module according to the aspect of the present disclosure, the physical quantity sensor may measure any one of mass, acceleration, angular velocity, angular acceleration, electrostatic capacitance, and temperature.

A structure monitoring device according to another aspect of the present disclosure includes the physical quantity sensor module according to the aspect of the present disclosure, a receiver that receives a measurement signal from the physical quantity sensor module attached to a structure, and a calculator that calculates an inclination angle of the structure based on a signal output from the receiver.

DESCRIPTION OF EXEMPLARY EMBODIMENTS

Hereinafter, preferred embodiments of the present disclosure will be described in detail with reference to drawings. The drawings used are for convenience of explanation. The embodiments described below do not unduly limit contents of the present disclosure described in the appended claims. In addition, not all of the configurations described below are necessarily essential components of the present disclosure.

1 Frequency Delta Sigma Modulation Signal Output Circuit 1.1 First Embodiment

Figure 1:
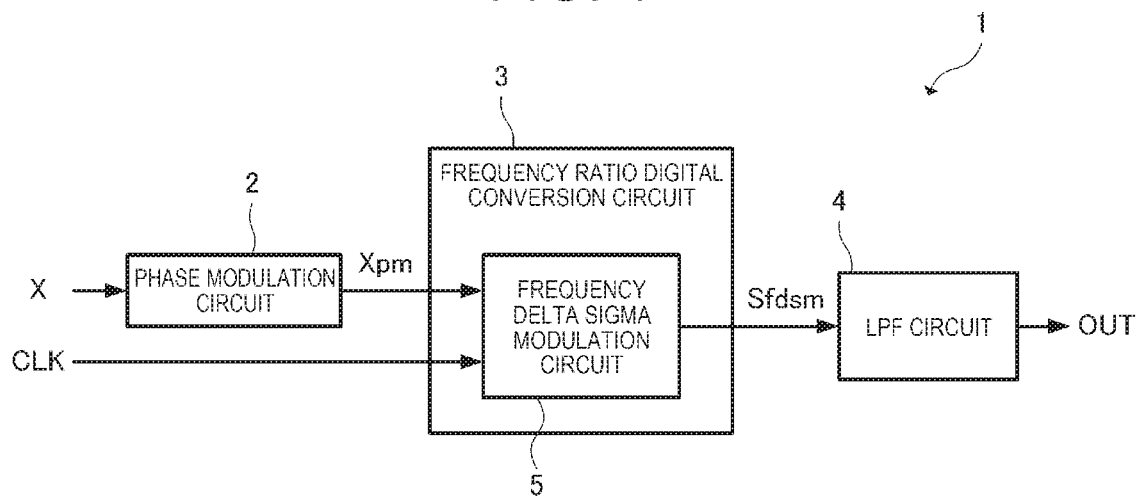
FIG. 1 is a block diagram illustrating a configuration of a frequency delta sigma modulation signal output circuit.

FIG. 1 is a block diagram illustrating a configuration of a frequency delta sigma modulation signal output circuit 1. As illustrated in FIG. 1, the frequency delta sigma modulation signal output circuit 1 includes a phase modulation circuit 2, a frequency ratio digital conversion circuit 3, a low pass filter (LPF) circuit 4.

A signal X to be measured including a reference signal CLK and a frequency signal of a measurement target is input to the frequency delta sigma modulation signal output circuit 1. The frequency delta sigma modulation signal output circuit 1 generates a frequency delta sigma modulation output signal OUT indicating the frequency ratio between the signal X to be measured and the reference signal CLK and outputs the frequency delta sigma modulation output signal OUT.

Specifically, the signal X to be measured is input to the phase modulation circuit 2. The phase modulation circuit 2 outputs a phase modulation signal Xpm based on a delay signal obtained by delaying the signal X to be measured in synchronization with the signal X to be measured. The frequency ratio digital conversion circuit 3 includes a frequency delta sigma modulation circuit 5. The frequency delta sigma modulation circuit 5 generates a frequency delta sigma modulation signal Sfdsm using the reference signal CLK and the phase modulation signal Xpm. The LPF circuit 4 extracts a low frequency component contained in the frequency delta sigma modulation signal Sfdsm and outputs the component as a frequency delta sigma modulation output signal OUT.

Here, details of the frequency delta sigma modulation circuit 5 and the phase modulation circuit 2 will be described with reference to FIGS. 2 and 3.

Figure 2:
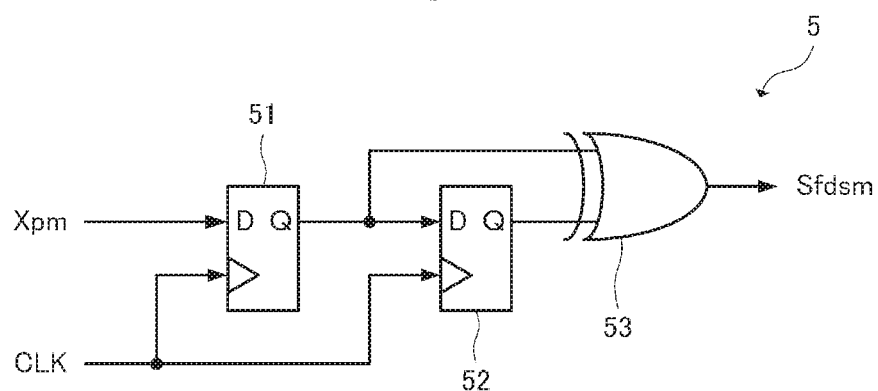
FIG. 2 is a circuit diagram illustrating a configuration of a frequency delta sigma modulation circuit.

FIG. 2 is a circuit diagram illustrating a configuration of the frequency delta sigma modulation circuit 5. The frequency delta sigma modulation circuit 5 includes D flip-flop circuits 51 and 52 and an exclusive OR circuit 53.

The D flip-flop circuit 51 holds the phase modulation signal Xpm in synchronization with a rising edge of the reference signal CLK. The D flip-flop circuit 52 holds the phase modulation signal Xpm held in the D flip-flop circuit 51 in synchronization with the rising edge of the reference signal CLK. The exclusive OR circuit 53 performs an exclusive OR operation of the signal held in the D flip-flop circuit 51 and the signal held in the D flip-flop circuit 52 and outputs the result of the exclusive OR operation as the frequency delta sigma modulation signal Sfdsm.

In the frequency delta sigma modulation circuit 5 configured as described above, a signal indicating the rising or falling timing of the phase modulation signal Xpm is output as the frequency delta sigma modulation signal Sfdsm. In the frequency delta sigma modulation circuit 5 configured as described above, it is possible to count both the rising edge and the falling edge of the phase modulation signal Xpm. In other words, in the frequency delta sigma modulation circuit 5 illustrated in FIG. 2, counting corresponding to twice the frequency becomes possible, and a signal to noise ratio (SNR) can be increased.

Figure 3:
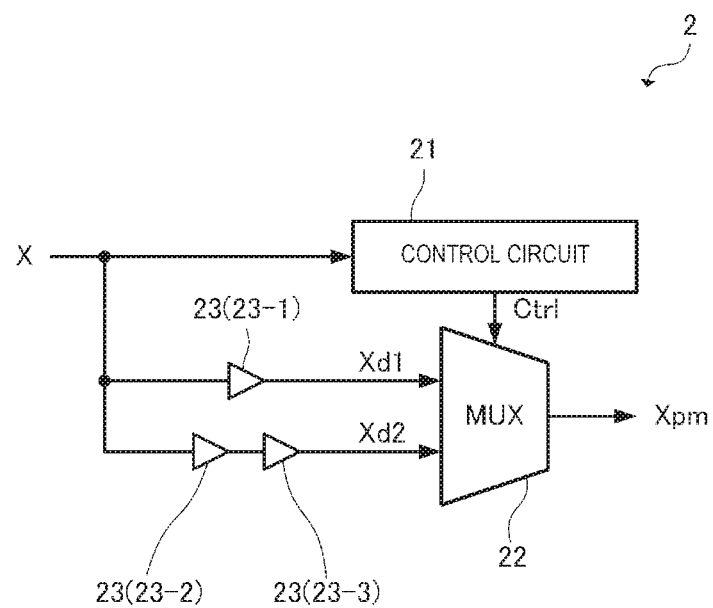
FIG. 3 is a circuit diagram illustrating a configuration of a phase modulation circuit.

FIG. 3 is a circuit diagram illustrating a configuration of the phase modulation circuit 2. The phase modulation circuit 2 includes a control circuit 21, a multiplexer (MUX) 22, and a plurality of delay circuits 23 (23-1 to 23-3). Then, the phase modulation circuit 2 periodically selects and uses one of delay signals Xd1 and Xd2 to generate the phase modulation signal Xpm.

The signal X to be measured is input to the control circuit 21. The control circuit 21 generates a control signal Ctrl synchronized with rising or falling of the signal X to be measured.

The delay signals Xd1 and Xd2 and the control signal Ctrl are input to the MUX 22. The delay signal Xd1 is a signal after the signal X to be measured has passed through the delay circuit 23-1 and the delay signal Xd2 is a signal after the signal X to be measured has passed through the delay circuits 23-2 and 23-3. Then, the MUX 22 generates and outputs the phase modulation signal Xpm by selecting one of the delay signals Xd1 and Xd2 according to the control signal Ctrl.

In the following description, it is assumed that all of the plurality of delay circuits 23 have the same configuration. Accordingly, the delay time occurring in each of the delay circuits 23-1, 23-2, and 23-3 is substantially equal. That is, when the delay time of the delay signal Xd1 with respect to the signal X to be measured is set as time $\Delta t$, the delay time of the delay signal Xd2 with respect to the signal X to be measured becomes the time $\Delta 2t$ twice the time $\Delta t$. Each delay circuit 23 may have a different configuration, or each delay circuit 23 may be configured to generate a different delay time.

Figure 4:
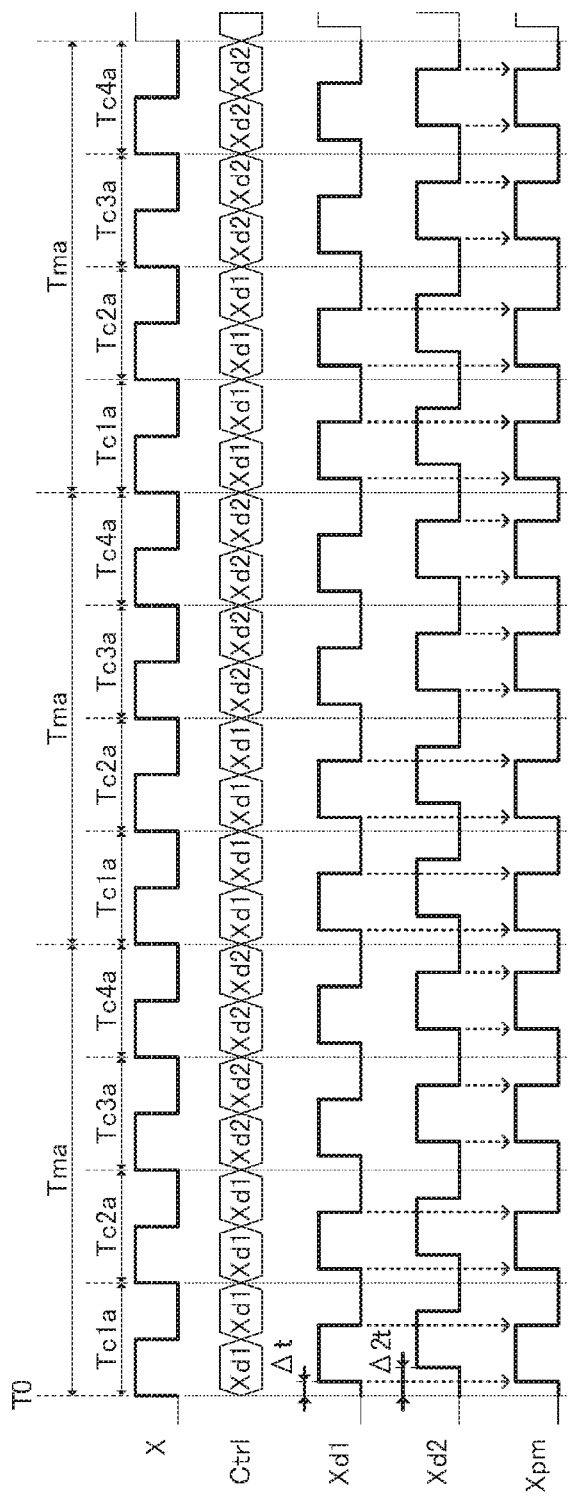
FIG. 4 is a timing chart for explaining an operation of the phase modulation circuit.

Here, an operation of the phase modulation circuit 2 will be described with reference to FIG. 4. FIG. 4 is a timing chart for explaining the operation of the phase modulation circuit 2.

In FIG. 4, an arbitrary reference time T0 within the rising of the signal X to be measured is illustrated. The control circuit 21 outputs a control signal Ctrl for controlling which of delay signals Xd1 and Xd2 is selected in a period Tc1a from the reference time T0 to the rising of the signal X to be measured. Specifically, within the period Tc1a, the control circuit 21 outputs the control signal Ctrl for selecting the delay signal Xd1 in a period from the rising edge to the falling edge of the signal X to be measured and outputs the control signal Ctrl for selecting the delay signal Xd1 in a period from the falling edge to the rising edge of the signal X to be measured.

As described above, the delay signal Xd1 is a signal delayed by the time Δt with respect to the signal X to be measured. Accordingly, the phase modulation signal Xpm in the period Tc1a is a signal that rises with a delay of time Δt and falls with a delay of time Δt with respect to the signal X to be measured.

After the period Tc1a, within a period Tc2a until the signal X to be measured rises next, the control circuit 21 outputs the control signal Ctrl for selecting the delay signal Xd1 in the period from the rising edge to the falling edge of the signal X to be measured and outputs the control signal Ctrl for selecting the delay signal Xd1 in the period from the falling edge to the rising edge of the signal X to be measured. Accordingly, the phase modulation signal Xpm in the period Tc2a is a signal that rises with the delay of time Δt and falls with the delay of time Δt with respect to the signal X to be measured.

After the period Tc2a, within a period Tc3a until the signal X to be measured rises next, the control circuit 21 outputs the control signal Ctrl for selecting a delay signal Xd2 in the period from the rising edge to the falling edge of the signal X to be measured and outputs the control signal Ctrl for selecting the delay signal Xd2 in the period from the falling edge to the rising edge of the signal X to be measured.

As described above, the delay signal Xd2 is a signal delayed by the time Δ2t with respect to the signal X to be measured. Accordingly, the phase modulation signal Xpm in the period Tc3a is a signal that rises with a delay of time Δ2t and falls with a delay of time Δ2t with respect to the signal X to be measured.

After the period Tc3a, within a period Tc4a until the signal X to be measured rises next, the control circuit 21 outputs the control signal Ctrl for selecting the delay signal Xd2 in the period from the rising edge to the falling edge of the signal X to be measured and outputs the control signal Ctrl for selecting the delay signal Xd2 in the period from the falling edge to the rising edge of the signal X to be measured. Accordingly, the phase modulation signal Xpm in the period Tc4a is a signal that rises with the delay of time Δ2t and falls with the delay of time Δ2t with respect to the signal X to be measured.

Then, the control circuit 21 repeats the periods Tc1a, Tc2a, Tc3a, and Tc4a described above for each cycle Tma.

As described above, in the frequency delta sigma modulation signal output circuit 1 in the first embodiment, the phase modulation circuit 2 generates the phase modulated signal Xpm modulated in the cycle Tma based on the control signal Ctrl output from the control circuit 21. Then, the frequency delta sigma modulation circuit 5 generates the frequency delta sigma modulation signal Sfdsm based on the phase modulation signal Xpm. That is, the time during which the phase modulation signal Xpm input to the frequency delta sigma modulation circuit 5 remains at a specific timing is reduced. Accordingly, in the frequency delta sigma modulation signal output circuit 1, a possibility of occurrence of the idle tone can be reduced.

Furthermore, in the frequency delta sigma modulation signal output circuit 1 in the first embodiment, there is no need to superimpose signals such as a sawtooth wave and a triangular wave on the input signal X to be measured and the reference signal CLK. Accordingly, it is possible to reduce an increase in a noise floor of the entire system and to improve accuracy of the frequency delta sigma modulation output signal OUT output from the frequency delta sigma modulation signal output circuit 1.

As illustrated in FIG. 1, the frequency delta sigma modulation signal output circuit 1 includes the LPF circuit 4 which is a filter circuit at a rear stage of the frequency ratio digital conversion circuit 3. As the LPF circuit 4, a general low-pass filter, a lag-lead filter, a flag filter, or the like can be used. By this LPF circuit 4, a frequency component equal to or higher than a predetermined cutoff frequency is blocked or reduced. Accordingly, it is possible to remove a noise component contained in the frequency delta sigma modulation output signal OUT, and it is possible to improve the accuracy of the frequency delta sigma modulation output signal OUT.

The cutoff frequency of this LPF circuit 4 is preferably lower than a frequency consisting of the reciprocal of the cycle Tma described above. In other words, it is preferable that modulation of the phase modulation signal Xpm includes the predetermined cycle Tma, and the frequency that is the reciprocal of the cycle Tma is higher than the cutoff frequency of the LPF circuit 4. With this configuration, it is possible to reduce the situation where a modulation signal of the period Tma included in the phase modulation signal Xpm is superimposed on the frequency delta sigma modulation output signal OUT. Accordingly, the accuracy of the frequency delta sigma modulation output signal OUT output from the frequency delta sigma modulation signal output circuit 1 can be further improved.

1.2 Second Embodiment

The frequency delta sigma modulation signal output circuit 1 in the second embodiment is different from the first embodiment in the phase modulation signal Xpm generated in the phase modulation circuit 2. In describing the frequency delta sigma modulation signal output circuit 1 of the second embodiment, the same reference numerals are given to the same components as those of the first embodiment, and the description thereof will be omitted.

Figure 5:
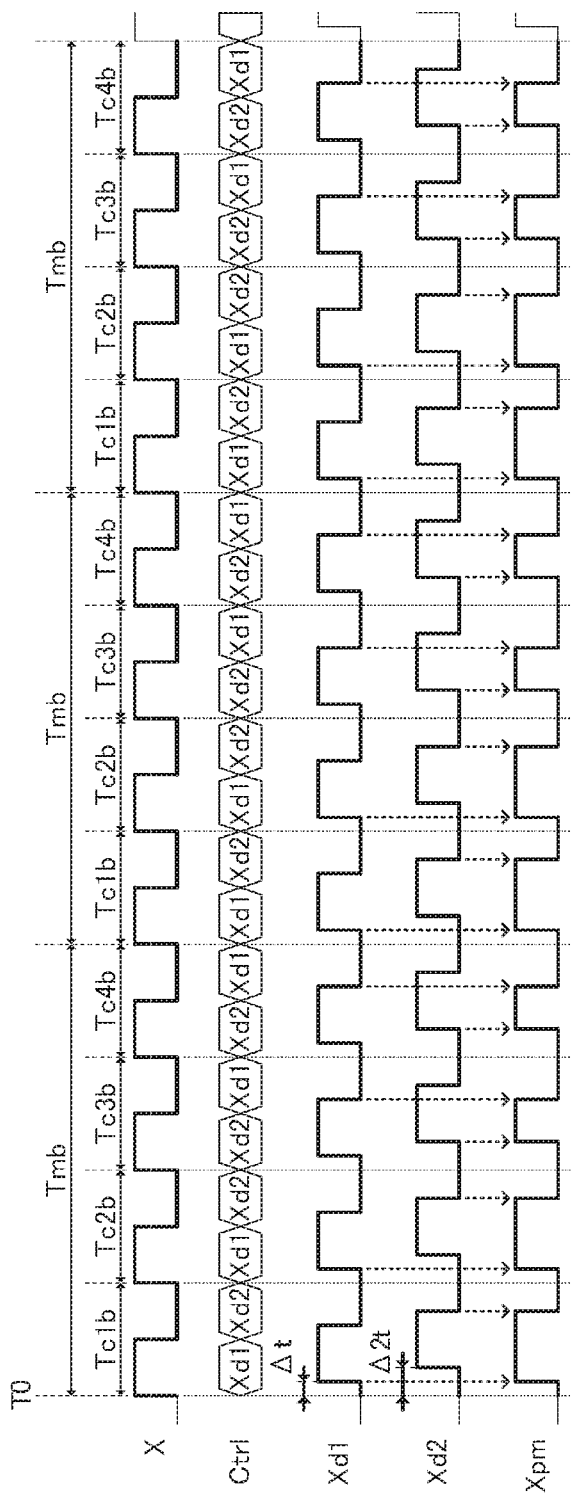
FIG. 5 is a timing chart for explaining an operation of a phase modulation circuit according to a second embodiment.

FIG. 5 is a timing chart for explaining the operation of the phase modulation circuit 2 in the second embodiment.

In FIG. 5, an arbitrary reference time T0 of the rising of the signal X to be measured is illustrated. The control circuit 21 outputs the control signal Ctrl for controlling which of delay signals Xd1 and Xd2 is selected in a period Tc1b from the reference time T0 to the rising of the signal X to be measured. Specifically, within the period Tc1b, the control circuit 21 outputs the control signal Ctrl for selecting the delay signal Xd1 in the period from the rising edge to the falling edge of the signal X to be measured and outputs the control signal Ctrl for selecting the delay signal Xd2 in the period from the falling edge to the rising edge of the signal X to be measured. Accordingly, the phase modulation signal Xpm in the period Tc1b is a signal that rises with a delay of time Δt and falls with a delay of time Δt with respect to the signal X to be measured.

After the period Tc1b, within a period Tc2b until the signal X to be measured rises next, the control circuit 21 outputs the control signal Ctrl for selecting the delay signal Xd1 in the period from the rising edge to the falling edge of the signal X to be measured and outputs the control signal Ctrl for selecting the delay signal Xd2 in the period from the falling edge to the rising edge of the signal X to be measured. Accordingly, the phase modulation signal Xpm in the period Tc2b is a signal that rises with the delay of time Δt and falls with the delay of time Δ2t with respect to the signal X to be measured.

After the period Tc2b, within a period Tc3b until the signal X to be measured rises next, the control circuit 21 outputs the control signal Ctrl for selecting the delay signal Xd2 in the period from the rising edge to the falling edge of the signal X to be measured and outputs the control signal Ctrl for selecting the delay signal Xd1 in the period from the falling edge to the rising edge of the signal X to be measured X. Accordingly, the phase modulation signal Xpm in the period Tc3b is a signal that rises with the delay of time Δ2t and falls with the delay of time Δt with respect to the signal X to be measured.

After the period Tc3b, within a period Tc4b until the signal X to be measured rises next, the control circuit 21 outputs the control signal Ctrl for selecting the delay signal Xd2 in the period from the rising edge to the falling edge of the signal X to be measured and outputs the control signal Ctrl for selecting the delay signal Xd1 in the period from the falling edge to the rising edge of the signal X to be measured. Accordingly, the phase modulation signal Xpm in the period Tc4b is a signal that rises with the delay of time Δ2t and falls with the delay of time Δt with respect to the signal X to be measured.

Then, the control circuit 21 repeats the periods Tc1b, Tc2b, Tc3b, and Tc4b described above for each cycle Tmb.

As described above, the phase modulation circuit 2 in the second embodiment generates the phase modulation signal Xpm having a different period during which the phase modulation signal Xpm is at a high level or a low level in the periods Tc1b, Tc2b, Tc3b, and Tc4b. Accordingly, the time during which the phase modulation signal Xpm input to the frequency delta sigma modulation circuit 5 remains at a specific timing is further reduced. Therefore, in the frequency delta sigma modulation signal output circuit 1 of the second embodiment, in addition to the effect described in the first embodiment, the possibility of occurrence of the idle tone can be further reduced. Here, a combination of the delay signals Xd1 and Xd2 selected by the control signal Ctrl is not limited to the example illustrated in FIG. 5.

1.3 Third Embodiment

The frequency delta sigma modulation signal output circuit 1 in the third embodiment is different from the first embodiment and the second embodiment in that there are three delay signals based on the signal X to be measured in the phase modulation circuit 2. In describing the frequency delta sigma modulation signal output circuit 1 of the third embodiment, the same reference numerals are given to the same components as those of the first embodiment or the second embodiment, and the description thereof may be omitted in some cases.

Figure 6:
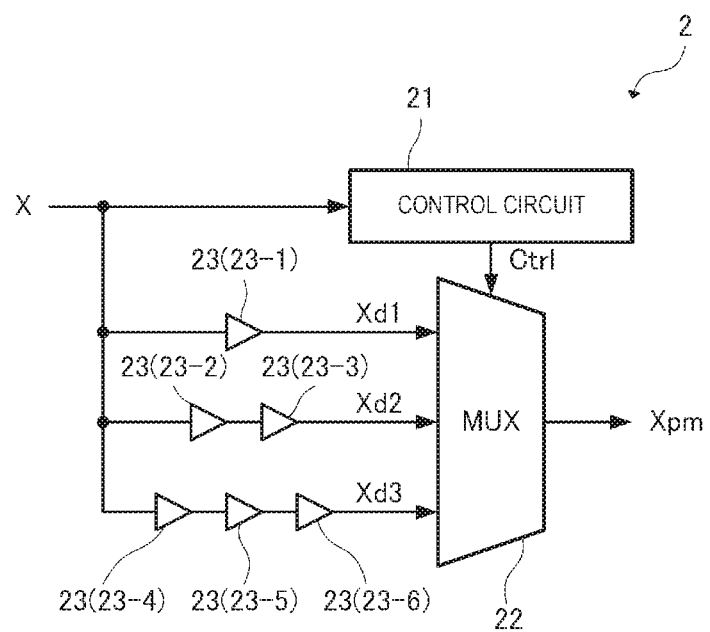
FIG. 6 is a circuit diagram illustrating a configuration of a phase modulation circuit according to a third embodiment.

FIG. 6 is a circuit diagram illustrating a configuration of the phase modulation circuit 2 in the third embodiment. The phase modulation circuit 2 includes the control circuit 21, the MUX 22, and a plurality of delay circuits 23 (23-1 to 23-6).

Similarly to the first embodiment, the signal X to be measured is input to the control circuit 21, and the control circuit 21 generates the control signal Ctrl synchronized with the rising or falling of the signal X to be measured.

Delay signals Xd1, Xd2, and Xd3 and the control signal Ctrl are input to the MUX 22. The delay signal Xd1 is a signal after the signal X to be measured has passed through the delay circuit 23-1, the delay signal Xd2 is a signal after the signal X to be measured has passed through the delay circuits 23-2 and 23-3, and the delay signal Xd3 is a signal after the signal X to be measured has passed through the delay circuits 23-4, 23-5, and 23-6. Then, the MUX 22 generates and outputs the phase modulation signal Xpm by selecting one of the delay signals Xd1, Xd2, and Xd3 according to the control signal Ctrl.

In the following description, description will be made by assuming that all of the plurality of delay circuits have the same configuration. Accordingly, the delay times occurring in the delay circuits 23-1, 23-2, 23-3, 23-4, 23-5, and 23-6 are substantially equal to each other. That is, when the delay time of the delay signal Xd1 with respect to the signal X to be measured is set as the time Δt, the delay time of the delay signal Xd2 with respect to the signal X to be measured becomes the time Δ2t twice the time Δt, and the delay time of the delay signal Xd3 with respect to the signal X to be measured becomes the time Δ3t three times the time Δt. Each delay circuit 23 may have a different configuration, or may be configured to generate a different delay time.

Figure 7:
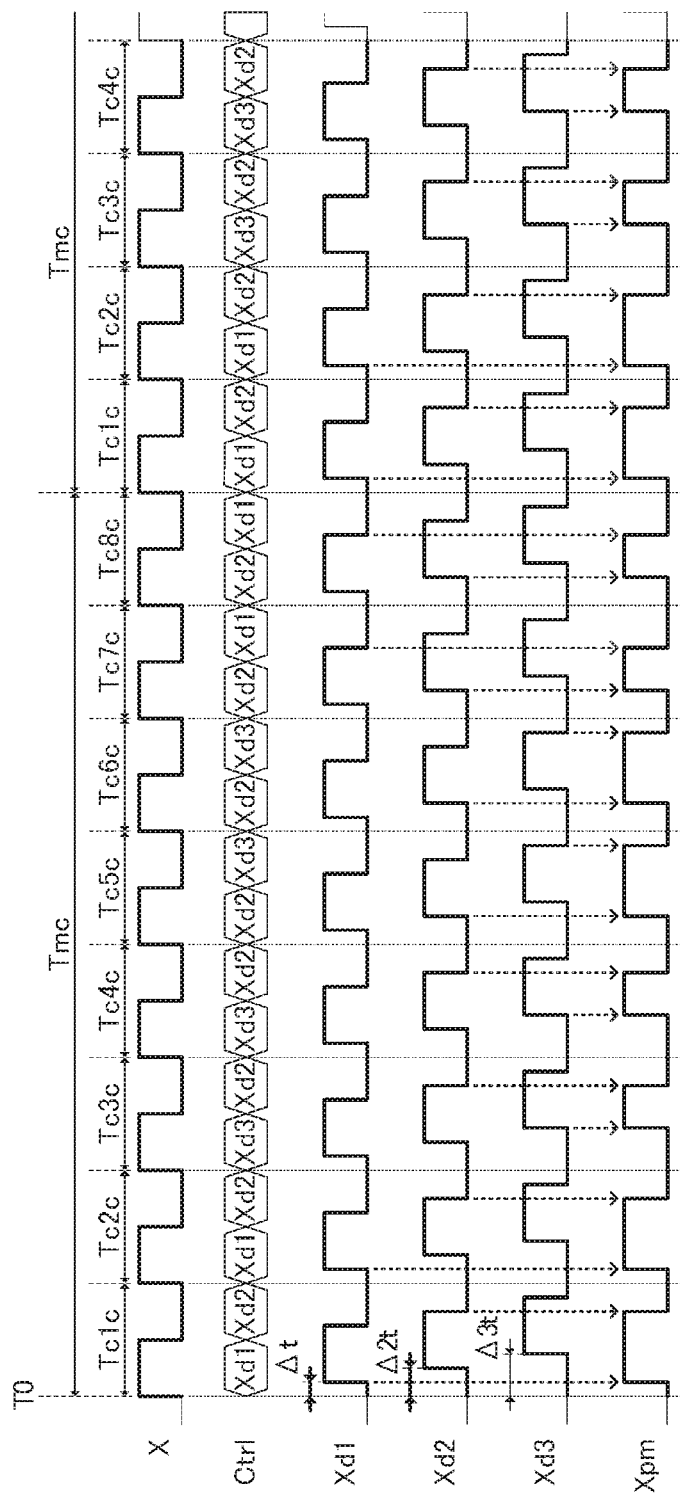
FIG. 7 is a timing chart for explaining an operation of the phase modulation circuit according to the third embodiment.

Here, an operation of the phase modulation circuit 2 in the third embodiment will be described with reference to FIG. 7. FIG. 7 is a timing chart for explaining the operation of the phase modulation circuit 2 in the third embodiment.

In FIG. 7, an arbitrary reference time T0 of the rising of the signal X to be measured is illustrated. The control circuit 21 outputs the control signal Ctrl for controlling which of delay signals Xd1, Xd2, and Xd3 is selected in a period Tc1c from the reference time T0 to the rising of the signal X to be measured. Specifically, within the period Tc1c, the control circuit 21 outputs the control signal Ctrl for selecting the delay signal Xd1 in the period from the rising edge to the falling edge of the signal X to be measured and outputs the control signal Ctrl for selecting the delay signal Xd2 in the period from the falling edge to the rising edge of the signal X to be measured. Accordingly, the phase modulation signal Xpm in the period Tc1c is a signal that rises with a delay of time Δt and falls with a delay of time Δ2t with respect to the signal X to be measured.

After the period Tc1c, within a period Tc2c until the signal X to be measured rises next, the control circuit 21 outputs the control signal Ctrl for selecting the delay signal Xd1 in the period from the rising edge to the falling edge of the signal X to be measured and outputs the control signal Ctrl for selecting the delay signal Xd2 in the period from the falling edge to the rising edge of the signal X to be measured. Accordingly, the phase modulation signal Xpm in the period Tc2c is a signal that rises with the delay of time Δt and falls with the delay of time Δ2t with respect to the signal X to be measured.

After the period Tc2c, within a period Tc3c until the signal X to be measured rises next, the control circuit 21 outputs the control signal Ctrl for selecting the delay signal Xd3 in the period from the rising edge to the falling edge of the signal X to be measured and outputs the control signal Ctrl for selecting the delay signal Xd2 in the period from the falling edge to the rising edge of the signal X to be measured. Accordingly, the phase modulation signal Xpm in the period Tc3c is a signal that rises with the delay of time Δ3t and falls with the delay of time Δ2t with respect to the signal X to be measured.

After the period Tc3c, within a period Tc4c until the signal X to be measured rises next, the control circuit 21 outputs the control signal Ctrl for selecting the delay signal Xd3 in the period from the rising edge to the falling edge of the signal X to be measured and outputs the control signal Ctrl for selecting the delay signal Xd2 in the period from the falling edge to the rising edge of the signal X to be measured. Accordingly, the phase modulation signal Xpm in the period Tc4c is a signal that rises with the delay of time Δ3t and falls with the delay of time Δ2t with respect to the signal X to be measured.

After the period Tc4c, within a period Tc5c until the signal X to be measured rises next, the control circuit 21 outputs the control signal Ctrl for selecting the delay signal Xd2 in the period from the rising edge to the falling edge of the signal X to be measured and outputs the control signal Ctrl for selecting the delay signal Xd3 in the period from the falling edge to the rising edge of the signal X to be measured. Accordingly, the phase modulation signal Xpm in the period Tc5c is a signal that rises with the delay of time Δ2t and falls with the delay of time Δ3t with respect to the signal X to be measured.

After the period Tc5c, within a period Tc6c until the signal X to be measured rises next, the control circuit 21 outputs the control signal Ctrl for selecting the delay signal Xd2 in the period from the rising edge to the falling edge of the signal X to be measured and outputs the control signal Ctrl for selecting the delay signal Xd3 in the period from the falling edge to the rising edge of the signal X to be measured. Accordingly, the phase modulation signal Xpm in the period Tc6c is a signal that rises with the delay of time Δ2t and falls with the delay of time Δ3t with respect to the signal X to be measured.

After the period Tc6c, within a period Tc7c until the signal X to be measured rises next, the control circuit 21 outputs the control signal Ctrl for selecting the delay signal Xd2 in the period from the rising edge to the falling edge of the signal X to be measured and outputs the control signal Ctrl for selecting the delay signal Xd1 in the period from the falling edge to the rising edge of the signal X to be measured. Accordingly, the phase modulation signal Xpm in the period Tc7c is a signal that rises with the delay of time Δ2t and falls with the delay of time Δt with respect to the signal X to be measured.

After the period Tc7c, within a period Tc8c until the signal X to be measured rises next, the control circuit 21 outputs the control signal Ctrl for selecting the delay signal Xd2 in the period from the rising edge to the falling edge of the signal X to be measured and outputs the control signal Ctrl for selecting the delay signal Xd1 in the period from the falling edge to the rising edge of the signal X to be measured. Accordingly, the phase modulation signal Xpm in the period Tc8c is a signal that rises with the delay of time Δ2t and falls with the delay of time Δt with respect to the signal X to be measured.

Then, the control circuit 21 repeats the periods Tc1c, Tc2c, Tc3c, Tc4c, Tc5c, Tc6c, Tc7c, and Tc8c described above for each cycle Tmc.

As described above, in the phase modulation circuit 2 in the third embodiment, it is possible to prescribe the phase modulation signal Xpm in more detail in the periods Tc1c, Tc2c, Tc3c, Tc4c, Tc5c, Tc6c, Tc7c, and Tc8c. Accordingly, the time during which the phase modulation signal Xpm input to the frequency delta sigma modulation circuit 5 remains at a specific timing is further reduced. Therefore, in the frequency delta sigma modulation signal output circuit 1, the possibility of occurrence of the idle tone can be further reduced.

In the third embodiment, the phase modulation signal Xpm is generated by using the three delay signals Xd1, Xd2, and Xd3, but may also be generated by using four or more delay signals. The combination of the delay signals Xd1, Xd2, and Xd3 selected by the control signal Ctrl is not limited to the example illustrated in FIG. 7.

As such, the combination of phase modulation of the phase modulation signal Xpm is provided in various modes such that the time during which the phase modulation signal Xpm input to the frequency delta sigma modulation circuit 5 remains at a specific timing is further reduced.

Accordingly, in the frequency delta modulation signal output circuit 1, the possibility of occurrence of the idle tone can be further reduced.

1.4 Fourth Embodiment

The frequency delta sigma modulation signal output circuit 1 in the fourth embodiment is different from the first embodiment, the second embodiment, and the third embodiment in that one of the signals input to the MUX 22 is the signal X to be measured in the phase modulation circuit 2. Specifically, the phase modulation circuit 2 periodically selects and uses one of the signal X to be measured and the delay signal Xd1 to generate the phase modulation signal Xpm. In describing the frequency delta sigma modulation signal output circuit 1 of the fourth embodiment, the same reference numerals are given to the same components as those of the first embodiment, the second embodiment, or the third embodiment, and the description thereof may be omitted in some cases.

Figure 8:
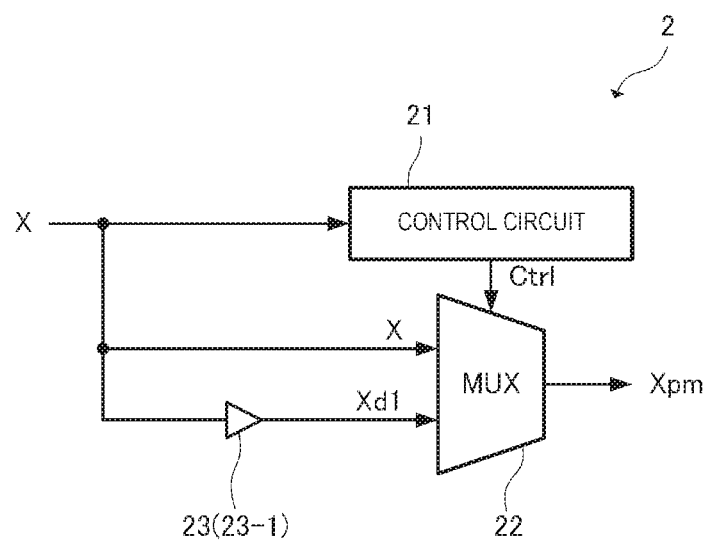
FIG. 8 is a circuit diagram illustrating a configuration of a phase modulation circuit according to a fourth embodiment.

FIG. 8 is a circuit diagram illustrating a configuration of the phase modulation circuit 2 in the fourth embodiment. The phase modulation circuit 2 includes the control circuit 21, the MUX 22, and the delay circuit 23.

Similarly to the first embodiment, the signal X to be measured is input to the control circuit 21, and the control circuit 21 generates the control signal Ctrl synchronized with the rising or falling of the signal X to be measured.

The signal X to be measured, the delay signal Xd1, and the control signal Ctrl are input to the MUX 22.

The delay signal Xd1 is a signal after the signal X to be measured has passed through the delay circuit 23-1.

Then, the MUX 22 generates and outputs the phase modulation signal Xpm by selecting one of the signal X to be measured and the delay signal Xd1 according to the control signal Ctrl.

Figure 9:
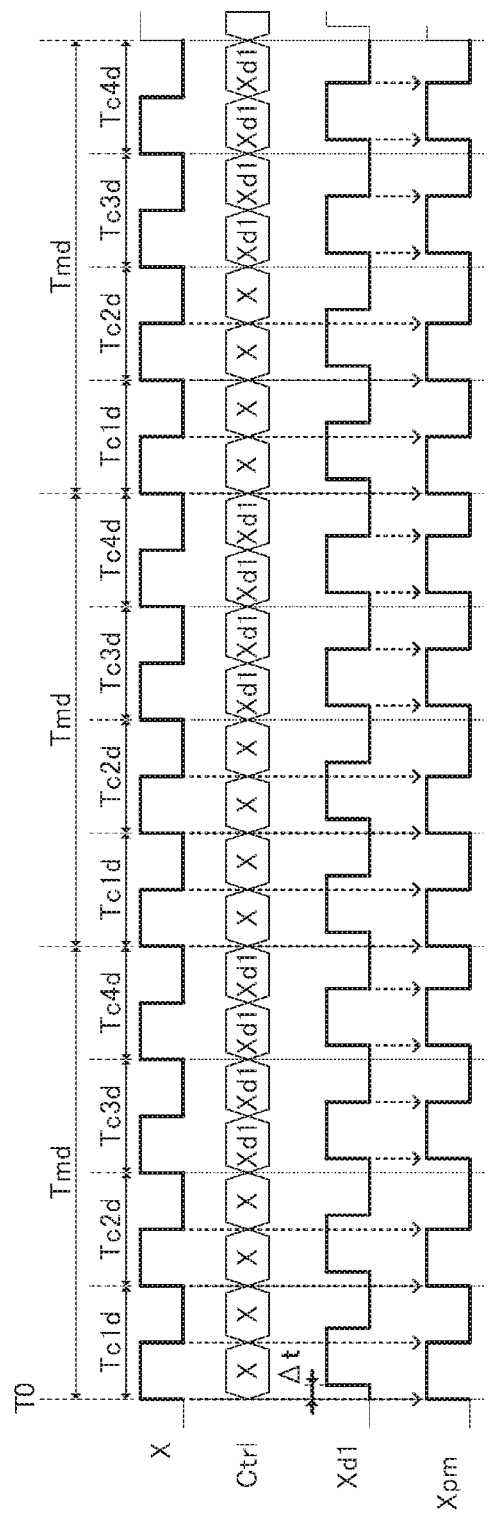
FIG. 9 is a timing chart for explaining an operation of the phase modulation circuit according to the fourth embodiment.

Here, an operation of the phase modulation circuit 2 in the fourth embodiment will be described with reference to FIG. 9. FIG. 9 is a timing chart for explaining the operation of the phase modulation circuit 2 in the fourth embodiment.

In FIG. 9, an arbitrary reference time T0 of the rising of the signal X to be measured is illustrated. The control circuit 21 outputs the control signal Ctrl for controlling which of the signal X to be measured and the delay signal Xd1 is selected in a period Tc1d from the reference time T0 to the rising of the signal X to be measured. Specifically, within the period Tc1d, the control circuit 21 outputs the control signal Ctrl for selecting the signal X to be measured in the period from the rising edge to the falling edge of the signal X to be measured and outputs the control signal Ctrl for selecting the signal X to be measured in the period from the falling edge to the rising edge of the signal X to be measured. Accordingly, the phase modulation signal Xpm in the period Tc1d is a signal that rises in synchronization with the signal X to be measured and falls in synchronization with the signal X to be measured.

After the period Tc1d, within a period Tc2d, until the signal X to be measured rises next, the control circuit 21 outputs the control signal Ctrl for selecting the signal X to be measured in the period from the rising edge to the falling edge of the signal X to be measured and outputs the control signal Ctrl for selecting the signal X to be measured in the period from the falling edge to the rising edge of the signal X to be measured. Accordingly, the phase modulation signal Xpm in the period Tc1d is a signal that rises in synchronization with the signal X to be measured and falls in synchronization with the signal X to be measured.

After the period Tc2d, within a period Tc3d until the signal X to be measured rises next, the control circuit 21 outputs the control signal Ctrl for selecting the delay signal Xd1 in the period from the rising edge to the falling edge of the signal X to be measured and outputs the control signal Ctrl for selecting the delay signal Xd1 in the period from the falling edge to the rising edge of the signal X to be measured. Accordingly, the phase modulation signal Xpm in the period Tc3d is a signal that rises with the delay of time Δt and falls with the delay of time Δt with respect to the signal X to be measured.

After the period Tc3d, within a period Tc4d until the signal X to be measured rises next, the control circuit 21 outputs the control signal Ctrl for selecting the delay signal Xd1 in the period from the rising edge to the falling edge of the signal X to be measured and outputs the control signal Ctrl for selecting the delay signal Xd1 in the period from the falling edge to the rising edge of the signal X to be measured. Accordingly, the phase modulation signal Xpm in the period Tc4d is a signal that rises with the delay of time Δt and falls with the delay of time Δt with respect to the signal X to be measured.

Then, the control circuit 21 repeats the periods Tc1d, Tc2d, Tc3d, and Tc4d described above for each cycle Tmd.

As described above, in the frequency delta sigma modulation signal output circuit 1 in the fourth embodiment, a phase modulation signal Xpm subjected to modulation in the cycle Tm is generated based on the signal X to be measured and the delay signal Xd1 in the phase modulation circuit 2. Accordingly, similarly to the first embodiment, the time during which the phase modulation signal Xpm input to the frequency delta sigma modulation circuit 5 remains at a specific timing is further reduced. Therefore, in the frequency delta sigma modulation signal output circuit 1, the possibility of occurrence of the idle tone can be reduced.

In the frequency delta sigma modulation signal output circuit 1 in the fourth embodiment, by using the signal X to be measured as one of the signals used for generating the phase modulation signal Xpm, it is possible to reduce the number of the delay circuits 23 in the phase modulation circuit 2, and it is also possible to miniaturize the frequency delta sigma modulation signal output circuit 1.

The phase modulation circuit 2 in the fourth embodiment generates the phase modulated signal Xpm based on a single signal X to be measured and a single delay signal Xd1, but may also generate the phase modulated signal Xpm based on a single signal X to be measured and a plurality of delay signals Xd1. With this configuration, it is possible to realize a wide variety of phase modulation signals Xpm, and it is possible to further reduce the time during which the phase modulation signal Xpm input to the frequency delta sigma modulation circuit 5 remains at a specific timing. Accordingly, in the frequency delta sigma modulation signal output circuit 1, it is possible to further reduce the possibility of occurrence of the idle tone.

1.5 Fifth Embodiment

The frequency delta sigma modulation signal output circuit 1 in the fifth embodiment is different from the first embodiment to the fourth embodiment in that the frequency ratio digital conversion circuit 3 includes a plurality of frequency delta sigma modulation circuits 5. Specifically, the frequency ratio digital conversion circuit 3 includes the plurality of frequency delta sigma modulation circuits 5 that are coupled in parallel. In describing the frequency delta sigma modulation signal output circuit 1 of the fifth embodiment, the same reference numerals are given to the same components as those of the first embodiment to the fourth embodiment, and the description thereof may be omitted in some cases.

Figure 10:
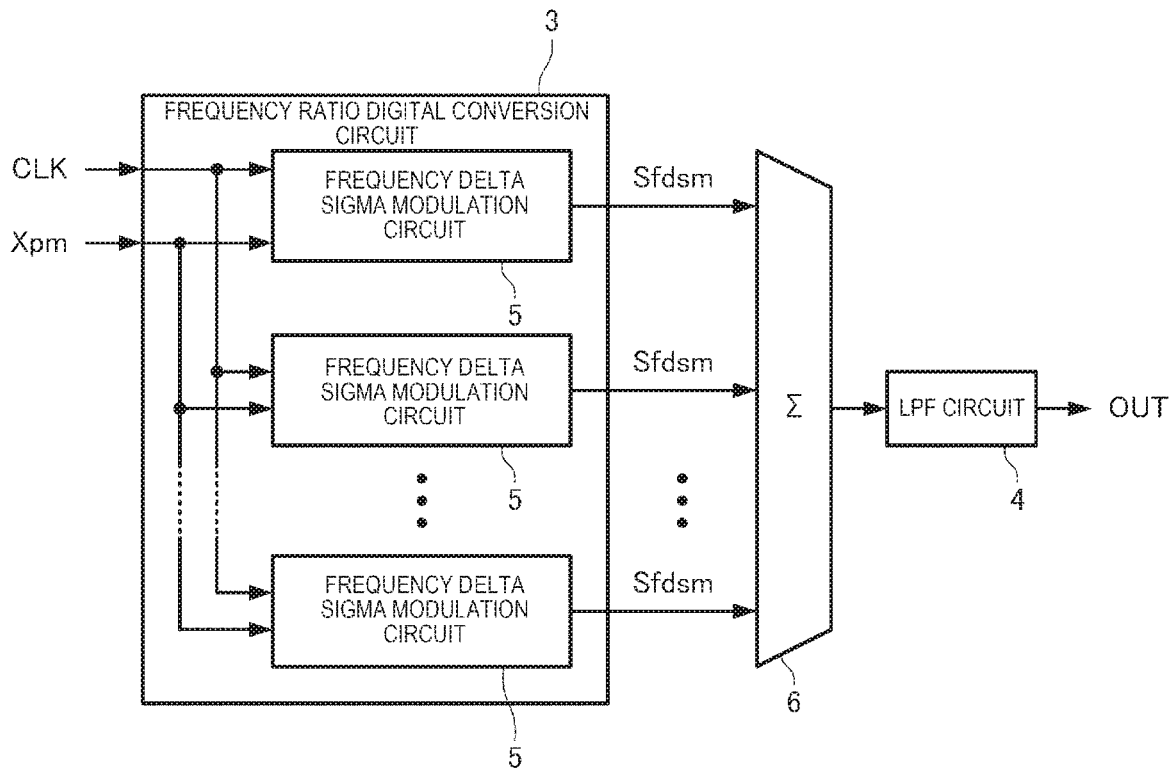
FIG. 10 is a block diagram illustrating a configuration of a frequency delta sigma modulation signal output circuit according to a fifth embodiment.

FIG. 10 is a block diagram illustrating a configuration of the frequency delta sigma modulation signal output circuit 1 in the fifth embodiment. In FIG. 10, the phase-modulated signal Xpm output from the phase modulation circuit 2 is illustrated, and illustration of the phase modulation circuit 2 is omitted. In the fifth embodiment, any one of the phase modulation circuits 2 of the first to fourth embodiments described above may be included.

As illustrated in FIG. 10, the frequency delta sigma modulation signal output circuit 1 of the fifth embodiment includes a plurality of frequency delta sigma modulation circuits 5 that are coupled in parallel in the frequency ratio digital conversion circuit 3, an adder 6, and the LPF circuit 4.

The reference signal CLK and the phase modulation signal Xpm are input to each of the plurality of frequency delta sigma modulation circuits 5. The frequency delta sigma modulation circuit 5 generates and outputs the frequency delta sigma modulation signal Sfdsm that indicates the timing of the rising or falling edge of an input phase modulation signal Xpm.

The frequency delta sigma modulation signal Sfdsm output from each of the plurality of frequency delta sigma modulation circuits 5 is input to the adder 6. The adder 6 adds the plurality of input frequency delta sigma modulation signals Sfdsm and outputs the addition resulted signal to the LPF circuit 4.

The LPF circuit 4 extracts the low frequency component from the signal output from the adder 6 and outputs the extracted frequency component as the frequency delta sigma modulation output signal OUT.

As described above, the frequency delta sigma modulation signal output circuit 1 includes the plurality of frequency delta sigma modulation circuits 5 that are coupled in parallel and as a result, it is possible to smooth the idle tone and it is possible to further reduce the influence of the idle tone on the SNR by smoothing.

For at least one of the reference signal CLK and the signal X to be measured input to a plurality of frequency delta sigma modulation circuits 5, a phase modulator such as a delay circuit for shifting the phase between the plurality of frequency delta sigma modulation circuits 5 may be provided. In this case, among the reference signal CLK and the signal X to be measured, a mode in which the phase of only the reference signal CLK is shifted, a mode in which the phase of only the signal X to be measured is shifted, and a mode in which the phases of the reference signal CLK and the signal X to be measured are shifted may be included.

With this configuration, the idle tone can be more effectively smoothed, and the influence of the idle tone on the SNR can be further reduced.

2 Physical Quantity Sensor Module

A physical quantity sensor module of this embodiment includes the frequency delta sigma modulation signal output circuit 1 according to the embodiments described above and a physical quantity sensor for outputting a the signal X to be measured which is an input signal of the frequency delta sigma modulation signal output circuit 1 and is a frequency signal of a measurement target, and outputs packet data incorporating detection data of the physical quantity. In the following description, the physical quantity sensor module 100, which is an acceleration sensor for measuring acceleration as a physical quantity, will be described as an example.

Figure 11:
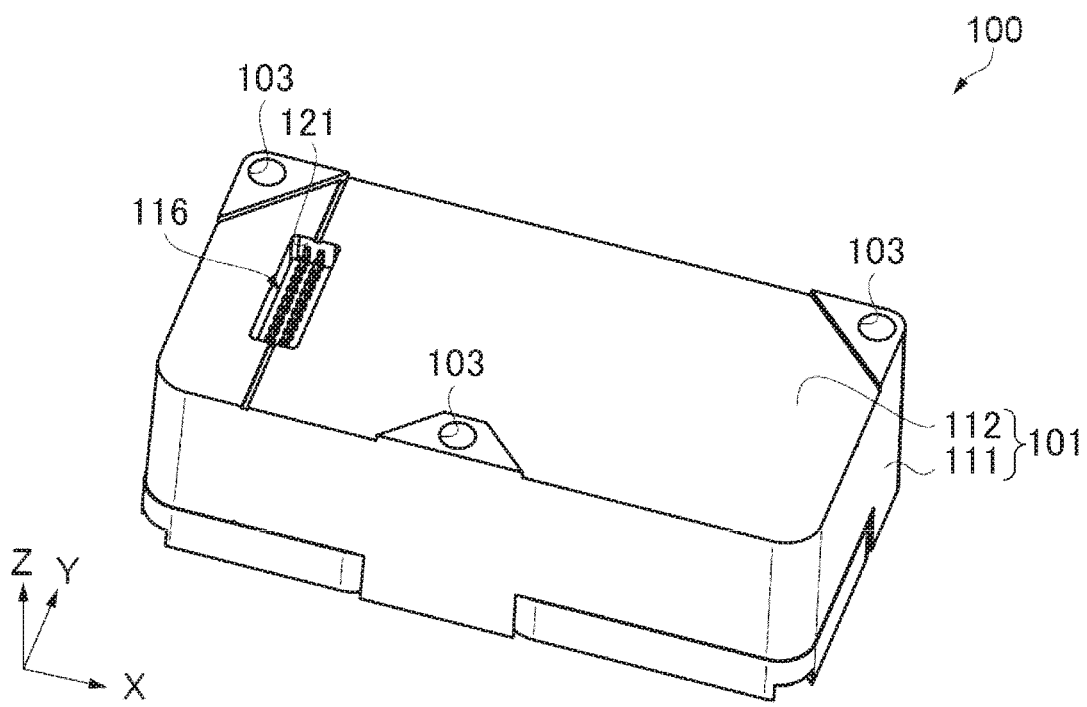
FIG. 11 is a perspective view illustrating a configuration of a physical quantity sensor module.

FIG. 11 is a perspective view illustrating a configuration of the physical quantity sensor module 100 when viewed from the side of a mounted surface to which the physical quantity sensor module 100 is fixed. In the following description, description will be made by setting a direction along the long side of the physical quantity sensor module 100 having a rectangular shape in a plan view as an X-axis direction, setting a direction orthogonal to the X-axis direction in a plan view as a Y-axis direction, and setting a thickness direction of the physical quantity sensor module 100 as a Z-axis direction.

The physical quantity sensor module 100 is a rectangular parallelepiped having a rectangular planar shape. For example, the length of the long side along the X-axis direction is approximately 50 mm and the length of the short side along the Y-axis direction orthogonal to the X-axis direction is approximately 24 mm, and the thickness is about 16 mm. Screw holes 103 are formed at two places near both end portions of one long side and at one place in the central portion of the other long side. The physical quantity sensor module 100 is used in a fixed state to each of the three screw holes 103 through fixing screws, for example, on a mounted surface of a mounted object (device) of a structure such as a bridge or a bulletin board.

As illustrated in FIG. 11, an opening 121 is provided on the front surface of the physical quantity sensor module 100 when viewed from the mounted surface side. Inside the opening 121, a plug type connector 116 is disposed. The connector 116 has a plurality of pins disposed in two rows, and in each row, a plurality of pins are arranged in the Y-axis direction. A socket type connector (not illustrated) is coupled to a connector 116 from the mounted object, and a drive voltage of the physical quantity sensor module 100 and electric signals such as detection data are transmitted and received through the connector.

Figure 12:
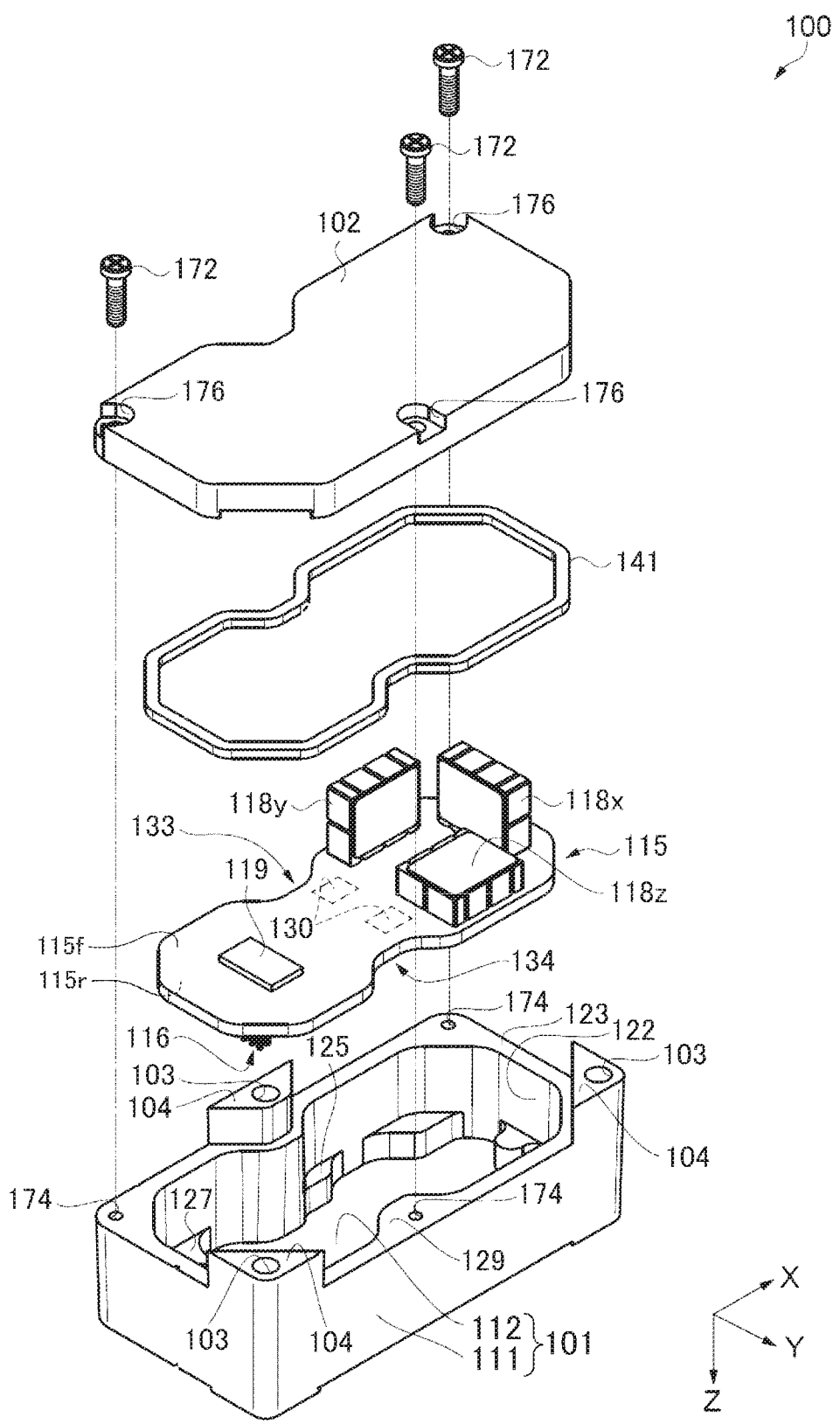
FIG. 12 is an exploded perspective view of the physical quantity sensor module.

FIG. 12 is an exploded perspective view of the physical quantity sensor module 100. As illustrated in FIG. 12, the physical quantity sensor module 100 is configured to include a container 101, a lid portion 102, a seal member 141, a circuit board 115, and the like. More specifically, the physical quantity sensor module 100 is configured such that the circuit board 115 is attached to the interior of the container 101 with a fixing member 130 interposed therebetween, and the opening of the container 101 is covered with a lid portion 102 via a seal member 141 having cushioning property.

The container 101 is made of, for example, aluminum, and is an accommodation container of the circuit board 115 formed into a box shape having an internal space. The container 101 can be formed by scraping out aluminum, or by using a die casting method (mold casting method). The material of the container 101 is not limited to aluminum, but other metal such as zinc or stainless steel, a resin, a composite material of metal and resin, or the like may be used. The outer shape of the container 101 is a rectangular parallelepiped having a substantially rectangular planar shape similarly to the whole shape of the physical quantity sensor module 100 described above, and fixing projections 104 are provided at two places near both end portions of one long side and one place in the central portion of the other long side. The screw hole 103 is formed in each of the fixing projections 104. Here, the fixing projections 104 provided at two places near both end portions of one long side include the intersection of the short side and the long side, and are substantially triangular in a plan view. Further, the fixing projection 104 provided at one place in the central portion of the other long side has a substantially trapezoidal shape facing the inner space side of the container 101 in a plan view.

The container 101 has a box-like shape whose outer shape is rectangular parallelepiped and opened to one side. The interior of the container 101 is an internal space (accommodating space) surrounded by a bottom wall 112 and side walls 111. In other words, the container 101 has a box shape having one surface facing the bottom wall 112 as an opening surface 123, the outer edge of the circuit board 115 is disposed (accommodated) along an inner surface 122 of the side wall 111, and the lid portion 102 is fixed so as to cover the opening. Here, an opening surface 123 facing the bottom wall 112 is a surface on which the lid portion 102 is placed. On the opening surface 123, the fixing projections 104 are erected at two places near both end portions of one long side and one place in the central portion of the other long side of the container 101. The upper surface (surface exposed in the −Z-direction) of the fixing projections 104 is flush with the upper surface of the container 101.

A projection 129, which is the center portion of one long side opposed to the fixing projection 104 provided at the central portion of the other long side and protrudes from the side wall 111 toward the internal space from the bottom wall 112 to the opening surface 123, is provided in the internal space of the container 101. A female screw 174 is provided on the upper surface (the same surface as the opening surface 123) of the projection 129. The lid portion 102 is fixed to the container 101 through the seal member 141 by screws 172 and the female screws 174 inserted through the through-holes 176. Here, similar to the projection 129, the fixing projection 104 provided at the central portion of the other long side may be configured to be protruded from the side wall 111 toward the internal space from the bottom wall 112 to the opening surface 123. The projection 129 and the fixing projection 104 are provided at positions facing constricted portions 133 and 134 of the circuit board 115 described later.

In the inner space of the container 101, a first pedestal 127 and a second pedestal 125 which project in a stepwise manner from the bottom wall 112 toward the opening surface 123 side by one step are provided. The first pedestal 127 is provided at a position opposed to a disposition area of the plug type (male) connector 116 attached to the circuit board 115, and an opening 121 (see FIG. 11) into which the plug type (male) connector 116 is inserted is provided. The first pedestal 127 functions as a pedestal for fixing the circuit board 115 to the container 101. The opening 121 penetrates the inside (inner side) and the outside of the container 101.

The second pedestal 125 is positioned on the side opposite to the first pedestal 127 with respect to the fixing projection 104 and the projection 129 respectively positioned at the central portions of the long sides and is provided in the vicinity of the fixing projection 104 and the projection 129. The second pedestal 125 may be coupled to either the fixing projection 104 or the projection 129. The second pedestal 125 functions as a pedestal for fixing the circuit board 115 to the container 101 on the side opposite to the first pedestal 127 with respect to the fixing projection 104 and the projection 129.

Although the outer shape of the container 101 has been described as being a rectangular parallelepiped having a substantially rectangular planar shape and a box-like shape without a lid, but is not limited thereto, and the planar shape of the outer shape of the container 101 may be a square shape, a hexagonal shape, an octagonal shape, or the like. In the planar shape of the outer shape of the container 101, corners of apex portions of a polygon may be chamfered, and furthermore, any of sides may be a planar shape formed by a curve. The planar shape of the interior of the container 101 is also not limited to the shape described above, and other shapes may be adopted. Furthermore, the outer shape of the container 101 and the planar shape of the inside thereof may be similar or not similar.

The circuit board 115 is a multilayer board having a plurality of through-holes and the like formed therein, and a glass epoxy board is used as the circuit board 115. The circuit board 115 is not limited to a glass epoxy board, but may be a rigid board capable of mounting a plurality of physical quantity sensors, electronic components, connectors, and the like. For example, a composite substrate or ceramic substrate may also be used.

The circuit board 115 has a second surface 115r on the bottom wall 112 side and a first surface 115f which is in a front and back relationship with the second surface 115r. On the first surface 115f of the circuit board 115, a control IC 119 as a processor and acceleration sensors 118x, 118y, and 118z as physical quantity sensors are mounted. The connector 116 is mounted on the second surface 115r of the circuit board 115. Although illustration and explanation thereof are omitted, other wiring, terminal electrodes, and the like may be provided on the circuit board 115.

The circuit board 115 includes the constricted portions 133 and 134 whose outer edges of the circuit board 115 are constricted at the central portion in the X-axis direction along the long side of the container 101 in a plan view. The constricted portions 133, 134 are provided on both sides of the circuit board 115 in the Y-axis direction in a plan view and constricted from the outer edge of the circuit board 115 toward the center. The constricted portions 133 and 134 are provided to face the projection 129 and the fixing projection 104 of the container 101.

The circuit board 115 is inserted into the internal space of the container 101 with the second surface 115r facing the first pedestal 127 and the second pedestal 125. The circuit board 115 is supported by the container 101 by the first pedestal 127 and the second pedestal 125.

Acceleration sensors 118x, 118y, and 118z for measuring acceleration as a physical quantity respectively measure accelerations in one axial direction. Specifically, the acceleration sensor 118x is erected so that the front and back surfaces of a package are oriented in the X-axis direction and also the side surfaces face the first surface 115f of the circuit board 115. Then, the acceleration sensor 118x measures acceleration applied in the X-axis direction. The acceleration sensor 118y is erected such that the front and back surfaces of the package are oriented in the Y-axis direction and also the side surfaces face the first surface 115f of the circuit board 115. Then, the acceleration sensor 118y measures acceleration applied in the Y-axis direction. The acceleration sensor 118z is provided so that the front and back surfaces of the package are oriented in the Z-axis direction, that is, the front and back surfaces of the package are directly facing the first surface 115f of the circuit board 115. Then, the acceleration sensor 118z measures acceleration applied in the Z-axis direction.

The control IC 119 as a processor is electrically coupled to the acceleration sensors 118x, 118y, and 118z through wirings (not illustrated). The control IC 119 is a micro controller unit (MCU), which incorporates the frequency delta sigma modulation signal output circuit 1 of the embodiments described above, a storing unit including a nonvolatile memory, and the like, controls each component of the physical quantity sensor module 100, generates detection data based on the output signals of the acceleration sensors 118x, 118y, and 118z, and generates packet data incorporating the detection data. The storing unit stores a program that defines the sequence and contents for measuring acceleration, a program that incorporates detection data into packet data, accompanying data, and the like. Although not illustrated, a plurality of other electronic components and the like may be mounted on the circuit board 115.

Here, the configurations of the acceleration sensors 118x, 118y, and 118z will be described with reference to FIGS. 13 and 14.

Figure 13:
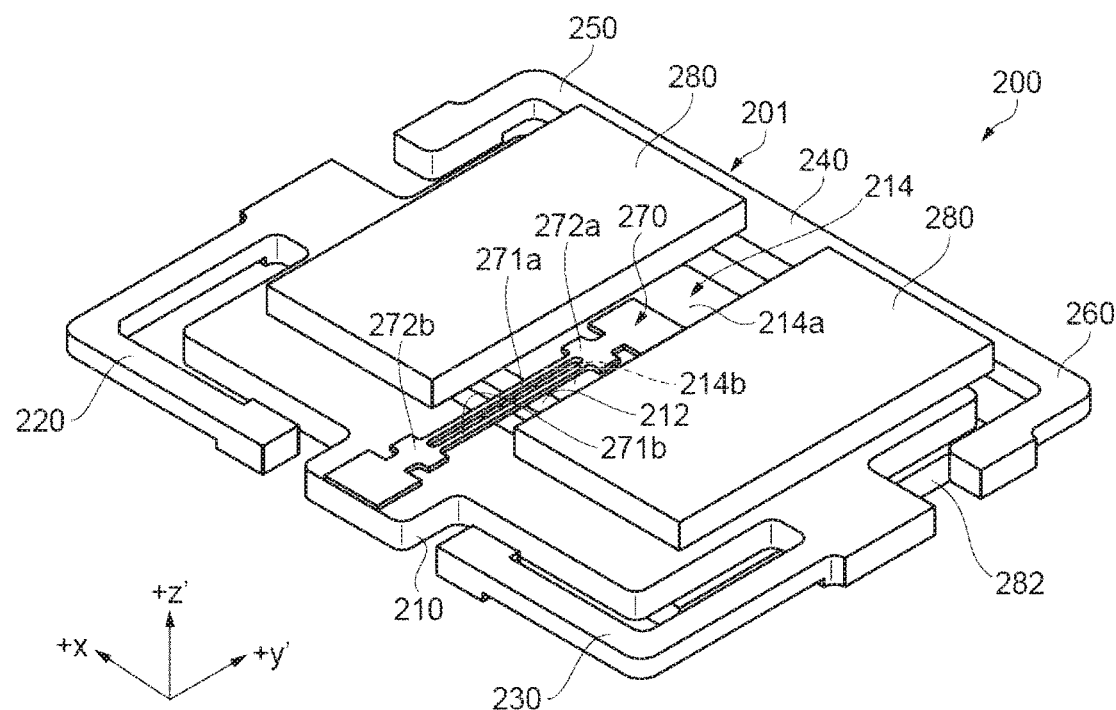
FIG. 13 is a perspective view for explaining a schematic configuration of a sensor element for measuring acceleration.

FIG. 13 is a perspective view for explaining a schematic configuration of a sensor element for measuring acceleration. FIG. 14 is a cross-sectional view illustrating a schematic configuration of an acceleration detector using the sensor element for measuring acceleration.

In FIG. 13, an x-axis, a y'-axis, and a z'-axis are illustrated as three axes orthogonal to each other. An example in which, in (for) each of the axes, in an orthogonal coordinate system consisting of the x-axis as an electric axis of quartz crystal which is a piezoelectric material used as a base material of an acceleration sensor, a y-axis as a mechanical axis, and a z-axis as an optical axis, when the axis obtained by inclining the z-axis by a rotation angle φ (preferably $-5° \leq \varphi \leq 15°$) with the x-axis as the rotation axis so that the +z side rotates in the −y direction of the y-axis is set as the z'-axis and the axis obtained by inclining the y-axis by the rotation angle φ with the x-axis as the rotation axis so that the +y side rotates in the +z direction of the z-axis is set as the y'-axis, a so-called quartz crystal z-plate (z'-plate) which is cut along a plane defined by the x-axis and the y'-axis and processed into a flat plate shape and has a predetermined thickness t in the z'-axis direction orthogonal to the plane is used as a base material will be described. The z'-axis is an axis along the direction in which gravity acts in the acceleration sensors 118x, 118y, and 118z.

First, a configuration of a sensor element 200 for measuring acceleration will be described with reference to FIG. 13. The sensor element 200 includes a substrate structure 201 including a base portion 210 and the like, an acceleration measurement element 270 coupled to the substrate structure 201 and measuring the physical quantity, and mass portions 280 and 282.

The substrate structure 201 of the sensor element 200 includes the base portion 210, a movable portion 214 coupled to the base portion 210 through a joint portion 212, and a connection portion 240, and a first support portion 220, a second support portion 230, a third support portion 250, and a fourth support portion 260 that are provided to be coupled to the base portion 210. Here, the third support portion 250 and the fourth support portion 260 are coupled at the side where the connection portion 240 is disposed.

As the substrate structure 201, a quartz crystal substrate of the quartz crystal z-plate (z'-plate) cut out at a predetermined angle from a quartz crystal rough stone or the like which is a piezoelectric material is used. By patterning the quartz crystal substrate, the support portions are integrally formed as a substrate structure 201. For patterning, for example, a photolithography technique and a wet etching technique can be used.

The base portion 210 is coupled to the movable portion 214 through the joint portion 212, and supports the movable portion 214. The base portion 210 is coupled to the movable portion 214 through the joint portion 212, the connection portion 240 positioned on a side opposite to the side, where the joint portion 212 is positioned, of the movable portion, the first support portion 220 and the second support portion 230, and the third support portion 250 and the fourth support portion 260 coupled to each other at the connection portion 240 side.

The joint portion 212 is provided between the base portion 210 and the movable portion 214, and is coupled to the base portion 210 and the movable portion 214. The thickness (length in the z'-axis direction) of the joint portion 212 is thin (short) as compared with the thickness of the base portion 210 and the thickness of the movable portion 214, and the joint portion 212 is formed in a constricted shape in a cross-sectional view from the x-axis direction. The joint portion 212 is formed, for example, as a thin-walled portion having a small thickness by performing so-called half etching on the substrate structure 201 including the joint portion 212. The joint portion 212 has a function as a rotation axis along the x-axis direction as a fulcrum (intermediate hinge) when the movable portion 214 is displaced (pivots) with respect to the base portion 210.

The movable portion 214 is coupled to the base portion 210 through the joint portion 212. The movable portion 214 has a plate shape, and has principal surfaces 214a and 214b facing each other along the z'-axis direction and having the front and back relationship. The movable portion 214 is displaced in a direction (z'-axis direction) intersecting the principal surfaces 214a and 214b with the joint portion 212 as a fulcrum (rotation axis), according to acceleration which is a physical quantity applied in the direction (z'-axis direction) intersecting the principal surfaces 214a and 214b.

The connection portion 240 extends from the base portion 210 on the +x direction side provided with the third support portion 250 described later along the x-axis direction so as to surround the movable portion 214, and is provided to be coupled to the base portion 210 on the −x direction side where the fourth support portion 260 described later is provided.

The first support portion 220 and the second support portion 230 are provided symmetrically with respect to the acceleration measurement element 270. The third support portion 250 and the fourth support portion 260 are provided symmetrically with respect to the acceleration measurement element 270. In the first support portion 220, the second support portion 230, the third support portion 250 and the fourth support portion 260, the substrate structure 201 is supported by a fixed portion.

The acceleration measurement element 270 is coupled to the base portion 210 and the movable portion 214. In other words, the acceleration measurement element 270 is provided so as to straddle the base portion 210 and the movable portion 214. The acceleration measurement element 270 includes vibrating beam portions 271a and 271b as a vibrating portion, a first base portion 272a, and a second base portion 272b. In the acceleration measurement element 270 in which the first base portion 272a and the second base portion 272b are coupled to the base portion 210, for example, the movable portion 214 is displaced according to the physical quantity so that stress is generated in the vibrating beam portions 271a and 271b and physical quantity detection information generated in the vibrating beam portions 271a and 271b changes. In other words, the vibration frequency (resonance frequency) of the vibrating beam portions 271a and 271b changes. The acceleration measurement element 270 in this embodiment is a double-ended tuning fork element (double-ended tuning fork type vibration element) having two vibrating beam portions 271a and 271b, the first base portion 272a, and the second base portion 272b. Here, the vibrating beam portions 271a and 271b as the vibrating portion may be referred to as a vibrating arm, a vibrating beam, a columnar beam, or the like in some cases.

As the acceleration measurement element 270, a quartz crystal substrate of a quartz crystal z-plate (z'-plate) cut out at a predetermined angle described above, similarly to the substrate structure 201, from a quartz crystal rough stone or the like which is a piezoelectric material is used. The acceleration measurement element 270 is formed by patterning the quartz crystal substrate by a photolithography technique and an etching technique. With this configuration, the vibrating beam portions 271a and 271b, the first base portion 272a, and the second base portion 272b can be integrally formed.

The material of the acceleration measurement element 270 is not limited to the quartz crystal substrate described above. As the material of the acceleration measurement element 270, for example, a semiconductor material such as, a piezoelectric material such as lithium tantalate ($LiTaO_3$), lithium tetraborate ($Li_2B_4O_7$), lithium niobate ($LiNbO_3$), lead zirconate titanate (PZT), zinc oxide (ZnO), or aluminum nitride (AlN), or silicon having a piezoelectric material (piezoelectric material) film such as zinc oxide (ZnO) or aluminum nitride (AlN) can be used. In this case, it is preferable that similar materials are used for the substrate structure 201 and the acceleration measurement element 270.

Although illustration and explanation are omitted, an extraction electrode and an excitation electrode may be provided in the acceleration measurement element 270.

The mass portions 280 and 282 are provided on the principal surface 214a of the movable portion 214 and the principal surface 214b serving as the back surface in a front and back relationship between the principal surfaces 214a and 214b. Specifically, the mass portions 280 and 282 are provided on the principal surface 214a and the principal surface 214b through a mass bonding material (not illustrated). Examples of the material of the mass portions 280 and 282 include metals such as copper (Cu) and gold (Au).

In this embodiment, the acceleration measurement element 270 is configured by a double-ended tuning fork oscillator (double-ended tuning fork type vibrating element) in which the vibrating portion is configured by two columnar beams of the vibrating beam portions 271a and 271b, but this acceleration measurement element 270 can also be configured by one columnar beam (single beam).

Next, a configuration of an acceleration detector 300 using the sensor element 200 for measuring acceleration will be described with reference to FIG. 14.

Figure 14:
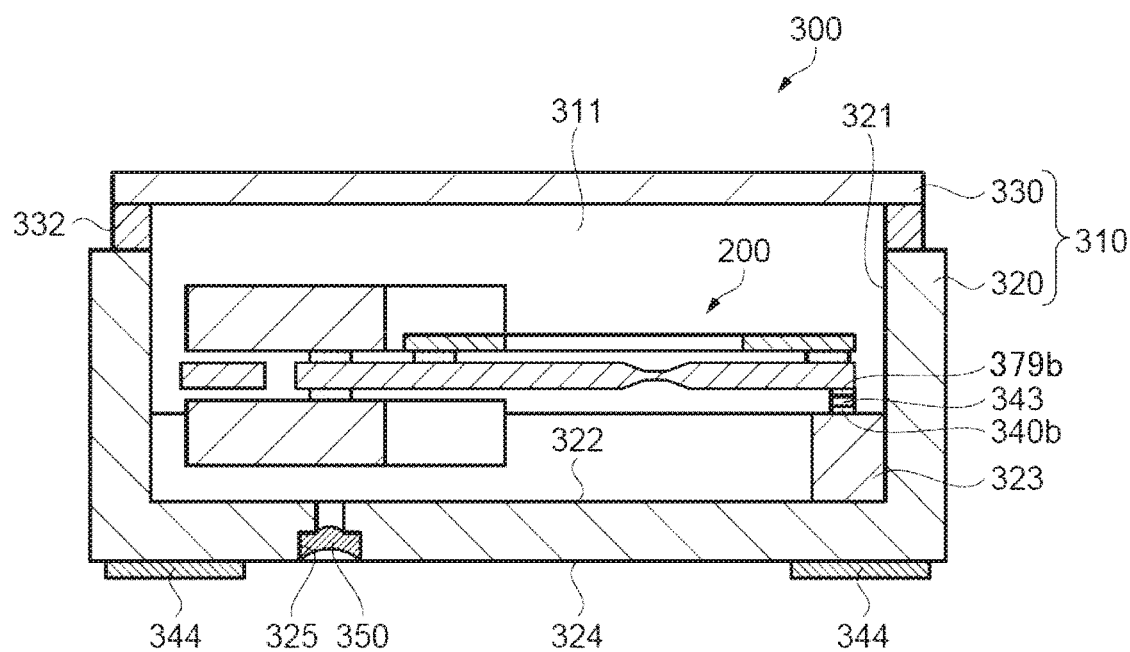
FIG. 14 is a cross-sectional view illustrating a schematic configuration of an acceleration detector using the sensor element for measuring acceleration.

As illustrated in FIG. 14, the sensor element 200 described above is mounted on the acceleration detector 300. The acceleration detector 300 includes the sensor element 200 and a package 310. The package 310 includes a package base 320 and a lid 330. Then, the sensor element 200 is accommodated in the package 310 of the acceleration detector 300. Specifically, the sensor element 200 is accommodated in a space 311 provided by coupling the package base 320 and the lid 330.

The package base 320 has a recess 321, and the sensor element 200 is provided in the recess 321. The shape of the package base 320 is not particularly limited as long as it can accommodate the sensor element 200 in the recess 321. As the package base 320 in this embodiment, for example, a material such as ceramics, quartz crystal or glass, silicon can be used.

The package base 320 has a step portion 323 protruding toward the lid 330 from an inner bottom surface 322 which is the bottom surface inside the recess of the package base 320. The step portion 323 is provided along the inner wall of the recess 321, for example. The step portion 323 is provided with a plurality of internal terminals 340b.

Each of the internal terminal 340b is provided so as to face a position overlapping with a fixing-portion connection terminal 379b, which is provided on each of the fixing portions of the first support portion 220, the second support portion 230, the third support portion 250, and the fourth support portion 260 of the sensor element 200, in a plan view. Each of the internal terminal 340b is electrically coupled to the fixing-portion connection terminal 379b using a silicone resin-based conductive adhesive 343 containing a conductive material such as a metal filler, for example. As such, the sensor element 200 is mounted on the package base 320 and accommodated in the package 310.

In the package base 320, on an outer bottom surface 324 which is an opposite surface to the inner bottom surface 322, external terminals 344 used when being mounted on an external member are provided. Each of the external terminals 344 is electrically coupled to each of the internal terminal 340b through an internal wiring (not illustrated).

The internal terminal 340b and the external terminal 344 are formed of a metal film obtained by laminating a film of nickel (Ni), gold (Au), or the like is laminated on a metalized layer of tungsten (W) or the like by plating or the like.

The package base 320 is provided with a sealing portion 350 for sealing the inside of the package 310 at the bottom portion of the recess 321. The sealing portion 350 is provided in a through-hole 325 formed in the package base 320. The through-hole 325 penetrates from the outer bottom surface 324 to the inner bottom surface 322. In the example illustrated in FIG. 14, the through-hole 325 has a stepped shape in which a hole diameter on the outer bottom surface 324 side is larger than the hole diameter on the inner bottom surface 322 side. The sealing portion 350 is formed by disposing a sealing material made of, for example, gold (Au) and germanium (Ge) alloy, solder, and the like in the through-hole 325, heating and melting the sealing material, and solidifying the sealing material. The sealing portion 350 is provided to hermetically seal the inside of the package 310.

The lid 330 is provided so as to cover the recess 321 of the package base 320. The shape of the lid 330 is, for example, a plate shape. As the lid 330, for example, the same material as the package base 320, an alloy of iron (Fe) and nickel (Ni), a metal such as stainless steel or the like can be used. The lid 330 is joined to the package base 320 through a lid joining member 332. As the lid joining member 332, for example, a seam ring, a low melting point glass, an inorganic adhesive or the like can be used.

The inside of the package 310 can be hermetically sealed by providing the sealing portion 350 by the disposing the sealing material in the through-hole 325, heating and melting the sealing material, and solidifying the sealing material in a state where the inside of the package 310 is depressurized (in a state of high degree of vacuum) after the lid 330 is joined to the package base 320. The inside of the package 310 may be filled with an inert gas such as nitrogen, helium, or argon.

In the acceleration detector 300, when a drive signal is given to the excitation electrode of the sensor element 200 through the external terminal 344, the internal terminal 340b, the fixing-portion connection terminal 379b, and the like, the vibrating beam portions 271a and 271b of the sensor element 200 vibrate at a predetermined frequency. Then, the acceleration detector 300 outputs the resonance frequency of the sensor element 200, which changes according to the applied acceleration, as an output signal. The acceleration detector 300 can be used as the acceleration sensors 118x, 118y, and 118z of the physical quantity sensor module 100 described above, and each of the acceleration sensors 118x, 118y, and 118z outputs a measured signal X having a frequency corresponding to applied acceleration.

According to the physical quantity sensor module 100 of the embodiments described above, since the physical quantity sensor module 100 includes the frequency delta sigma modulation signal output circuit 1 capable of reducing noise and floor noise and reducing the possibility of occurrence of the idle tone, it is possible to detect the physical quantity with high accuracy.

In the description as above, the physical quantity sensor module 100 including the acceleration sensors 118x, 118y, and 118z is described as an example of the physical quantity sensor. However, a physical quantity sensor module including a physical quantity sensor for measuring at least one of mass, angular velocity, angular acceleration, electrostatic capacitance and temperature as the physical quantity may be adopted.

A quartz crystal microbalance (QCM) is known as a method of measuring a minute mass change in a mass sensor that measures mass as a physical quantity. In such a mass sensor, the matters that the oscillation frequency of the crystal oscillator decreases as an amount of substances attached to the quartz crystal oscillator electrode surface increases, and the oscillation frequency increases as the attached substance amount decreases are utilized. Measurement sensitivity of the mass sensor as described above can be calculated by Sauerbrey's equation. For example, in the case of an AT-cut quartz crystal resonator having a fundamental frequency of 27 MHz, a decrease in the frequency of 1 Hz corresponds to a mass increase of 0.62 ng/cm$^2$ on the electrode surface.

In a case where an object spinning at angular velocity ω is observed from an observation point spinning at angular velocity Ω, an angular velocity sensor measuring the angular velocity or angular acceleration as a physical quantity measures the angular velocity using the matters that the angular velocity of the object appears as "ω-Ω". In such an angular velocity sensor, matters that an appearing resonance frequency observed from the electrode changes when a sensor element receives angular acceleration in a state where a wave having a natural frequency is circulated by electrostatically driving disc-shaped mass using an electrode are utilized. In the angular velocity sensor as described above, there is no limitation on a bandwidth in principle, and for example, accuracy improvement of technology related to frequency measurement and nonlinearity correction directly leads to higher sensitivity of the measurement sensitivity.

In an electrostatic capacitance sensor that measures electrostatic capacitance as the physical quantity, it is possible to measure electrostatic capacitance to be measured by causing RC oscillation to occur using a reference resistance and electrostatic capacitance to be measured and measuring an oscillation frequency. Then, the matters that the time constant given by the RC changes and the oscillation frequency shifts when the electrostatic capacitance to be measured changes are utilized. In the electrostatic capacitance sensor, various error factors can be eliminated in such a way that reference electrostatic capacitance is prepared separately from the capacitance to be measured, the RC oscillation is caused by using the reference resistance and the reference electrostatic capacitance, and this RC oscillation is set as a reference oscillation frequency to thereby set a mechanism for detecting the difference between the reference oscillation frequency and the previous oscillation frequency.

In a temperature sensor that measures temperature as a physical quantity, temperature measurement can be performed by causing RC oscillation to occur using a thermistor and a reference electrostatic capacitance and measuring the oscillation frequency. Then, the matters that the time constant given by the RC changes and the oscillation frequency shifts when a resistance value of a thermistor varies with temperature are utilized. In the temperature sensor, various error factors can be eliminated in such a way that a reference resistance is prepared separately from the thermistor, the RC oscillation is caused by using the reference resistance and the reference electrostatic capacitance, and this RC oscillation is set as a reference oscillation frequency to thereby set a mechanism for detecting the difference between the reference oscillation frequency and the previous oscillation frequency.

Since the physical quantity sensor module 100 including a physical quantity sensor for measuring various physical quantities as described above also includes the frequency delta sigma modulation signal output circuit 1 capable of reducing noise and floor noise and reducing the possibility of occurrence of the idle tone, so that the physical quantity can be detected with high accuracy.

3 Structure Monitoring Device (SHM: Structural Health Monitoring)

Figure 15:
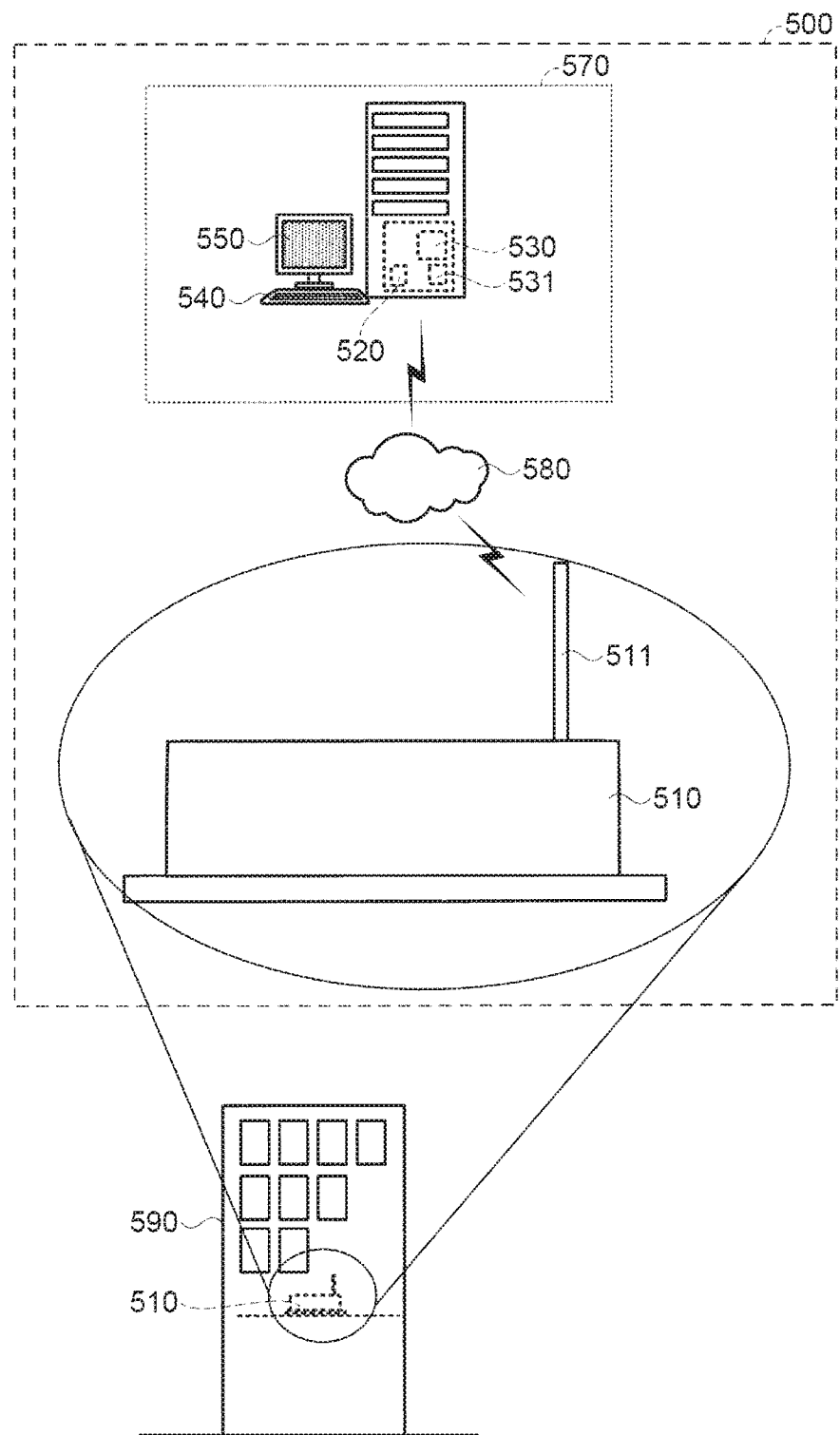
FIG. 15 is a configuration diagram of a structure monitoring device.

FIG. 15 is a configuration diagram of a structural health monitoring (SHM) which is a structure monitoring device. As illustrated in FIG. 15, a structure monitoring device 500 according to this embodiment includes a physical quantity sensor module 510 having the same function as the physical quantity sensor module 100 of the embodiment described above and attached to a structure 590 to be monitored. The physical quantity sensor module 510 includes a transmitter 511 that transmits a measurement signal. The transmitter 511 may be realized as a communication module and an antenna separate from the physical quantity sensor module 510.

The physical quantity sensor module 510 is coupled to a monitoring computer 570, for example, through a wireless or wired communication network 580. The monitoring computer 570 includes a receiver 520 coupled to the physical quantity sensor module 510 through the communication network 580 and a calculator 530 for calculating an inclination angle of the structure 590 based on a reception signal output from the receiver 520.

In this embodiment, the calculator 530 is realized by an application specific integrated circuit (ASIC), a field programmable gate array (FPGA) or the like mounted on the monitoring computer 570. However, a configuration in which the calculator 530 is realized by software by performing computation processing on a program stored in an IC memory 531 by a processor such as a central processing unit (CPU) may be adopted. The monitoring computer 570 can receive various operation inputs of the operator through a keyboard 540 and display the result of operation processing on a touch panel 550.

According to the structure monitoring device 500 of this embodiment, the inclination of the structure 590 is monitored using the physical quantity sensor module 510 having the same function as the physical quantity sensor module 100 of the embodiments described above. For that reason, it is possible to utilize highly accurate detection of the physical quantity (acceleration, angular velocity, and the like) which is an operational effect of the physical quantity sensor module 100, it is possible to accurately detect the inclination of the structure 590 to be monitored, and it is possible to improve the monitoring quality of the structure 590.

Although the embodiments and modification example have been described as above, the present disclosure is not limited to these embodiments and can be implemented in various aspects without departing from the gist thereof. For example, the embodiments described above can be combined as appropriate.

The present disclosure includes a configuration (for example, a configuration having the same function, method and result, or a configuration having the same object and effect) which is substantially the same as the configuration described in the embodiments. The present disclosure includes a configuration in which non-essential parts of the configuration described in the embodiment are replaced. Further, the present disclosure includes a configuration that achieves the same operation and effect as the configuration described in the embodiment, or a configuration that can achieve the same object. The present disclosure includes a configuration in which a publicly-known technique is added to the configuration described in the embodiment.

What is claimed is:

1. A frequency delta sigma modulation signal output circuit comprising:
a phase modulation circuit that outputs a phase modulation signal based on a delay signal obtained by delaying a signal to be measured, in synchronization with the signal to be measured, and
a frequency ratio digital conversion circuit that generates a frequency delta sigma modulation signal using a reference signal and the phase modulation signal,
wherein the phase modulation circuit generates the phase modulation signal by selecting and using one of a plurality of the delay signals.

2. The frequency delta sigma modulation signal output circuit according to claim 1,
wherein the phase modulation circuit generates the phase modulation signal by periodically selecting and using one of the plurality of delay signals.

3. A frequency delta sigma modulation signal output circuit comprising:
a phase modulation circuit that outputs a phase modulation signal based on a delay signal obtained by delaying a signal to be measured, in synchronization with the signal to be measured, and
a frequency ratio digital conversion circuit that generates a frequency delta sigma modulation signal using a reference signal and the phase modulation signal, wherein the phase modulation circuit generates the phase modulation signal by selecting and using any one of the signal to be measured and the delay signal.

4. The frequency delta sigma modulation signal output circuit according to claim 3,
wherein the phase modulation circuit generates the phase modulation signal by periodically selecting and using any one of the signal to be measured and the delay signal.

5. The frequency delta sigma modulation signal output circuit according to claim 1,
wherein the frequency ratio digital conversion circuit includes a plurality of frequency delta sigma modulation circuits coupled in parallel.

6. A frequency delta sigma modulation signal output circuit comprising:
a phase modulation circuit that outputs a phase modulation signal based on a delay signal obtained by delaying a signal to be measured, in synchronization with the signal to be measured, and
a frequency ratio digital conversion circuit that generates a frequency delta sigma modulation using a reference signal and the phase modulation signal,
wherein a filter circuit is provided behind the frequency ratio digital conversion circuit.

7. The frequency delta sigma modulation signal output circuit according to claim 6,
wherein the filter circuit is a low pass filter circuit,
modulation of the phase modulation signal includes a predetermined cycle, and
a frequency which is a reciprocal of the predetermined cycle is higher than a cutoff frequency of the low pass filter circuit.

8. A physical quantity sensor module comprising:
the frequency delta sigma modulation signal output circuit according to claim 1; and
a physical quantity sensor that outputs the signal to be measured.

9. The physical quantity sensor module according to claim 8,
wherein the physical quantity sensor measures any of mass, acceleration, angular velocity, angular acceleration, electrostatic capacitance, and temperature.

10. A structure monitoring device comprising:
the physical quantity sensor module according to claim 8;
a receiver that receives a measurement signal from the physical quantity sensor module attached to a structure; and
a calculator that calculates an inclination angle of the structure based on a signal output from the receiver.

11. The frequency delta sigma modulation signal output circuit according to claim 3,
wherein the frequency ratio digital conversion circuit includes a plurality of frequency delta sigma modulation circuits coupled in parallel.

12. The frequency delta sigma modulation signal output circuit according to claim 6,
wherein the frequency ratio digital conversion circuit includes a plurality of frequency delta sigma modulation circuits coupled in parallel.

* * * * *